(12) United States Patent
Kawakami

(10) Patent No.: US 6,546,544 B1
(45) Date of Patent: Apr. 8, 2003

(54) METHOD OF PRODUCING MASK DATA FOR PARTIAL ONE-SHOT TRANSFER EXPOSURE AND EXPOSURE METHOD

(75) Inventor: Kenichi Kawakami, Tokyo (JP)

(73) Assignee: Advantest Corporation, Tokyo (JP)

( * ) Notice: Subject to any disclaimer, the term of this patent is extended or adjusted under 35 U.S.C. 154(b) by 154 days.

(21) Appl. No.: 09/704,468

(22) Filed: Nov. 1, 2000

(30) Foreign Application Priority Data

Nov. 2, 1999 (JP) ............................................ 11-312337

(51) Int. Cl.[7] .............................................. G06F 17/50
(52) U.S. Cl. ............................. 716/21; 716/20; 716/19
(58) Field of Search ....................... 716/19–21; 355/53; 382/145

(56) References Cited

U.S. PATENT DOCUMENTS

| | | | | |
|---|---|---|---|---|
| 5,448,494 A | * | 9/1995 | Kobayashi et al. | 250/492.22 |
| 5,533,148 A | * | 7/1996 | Sayah et al. | 382/240 |
| 5,537,487 A | | 7/1996 | Miyajima et al. | 382/144 |
| 5,917,579 A | * | 6/1999 | Miyajima | 250/492.23 |
| 5,960,107 A | * | 9/1999 | Leroux | 356/618 |
| 5,968,692 A | | 10/1999 | Kasai et al. | |
| 5,984,505 A | | 11/1999 | Miyajima | 364/468.28 |
| 6,187,483 B1 | * | 2/2001 | Capodieci et al. | 430/5 |
| 6,192,510 B1 | * | 2/2001 | Yamada | 378/35 |

FOREIGN PATENT DOCUMENTS

| | | |
|---|---|---|
| EP | 0 936 658 | 8/1999 |
| JP | 9-45599 | 2/1997 |
| JP | 10-256135 | 9/1998 |
| JP | 11-40482 | 2/1999 |
| JP | 2000-195781 | 7/2000 |

* cited by examiner

Primary Examiner—Vuthe Siek
Assistant Examiner—Binh Tat
(74) Attorney, Agent, or Firm—Christie, Parker & Hale, LLP

(57) ABSTRACT

A method of producing mask data for partial one-shot transfer (block) exposure suitable for fabrication of an integrated circuit such as a system LSI in small numbers, in many models and with a short turnaround time (TAT) is disclosed, in which the ratio of the block mask fabrication cost to the total production cost and TAT are further reduced. In the partial one-shot transfer exposure method, at least a part of the pattern of the integrated circuit designed by at least partially combining a plurality of basic elements is passed through one of a plurality of block patterns of the block mask, and the radiation of the pattern shaped beams are combined for exposure. When producing the mask data related to the block mask used in this exposure method, a pattern group is generated in each layer of the integrated circuit including a plurality of basic elements, the degree of frequency at which each basic element in the integrated circuit is used is analyzed, and based on the analyzed degree of frequency at which each basic element is used, a plurality of block patterns to be used are selected from a pattern group, a mask layout is determined by determining the arrangement of the selected patterns in the block mask, each pattern of the mask layout is deformed based on the process conditions, and thus the mask data indicating the shape of a plurality of block patterns is generated, while at the same time generating auxiliary information containing the arrangement of a plurality of block patterns on the block mask.

15 Claims, 10 Drawing Sheets

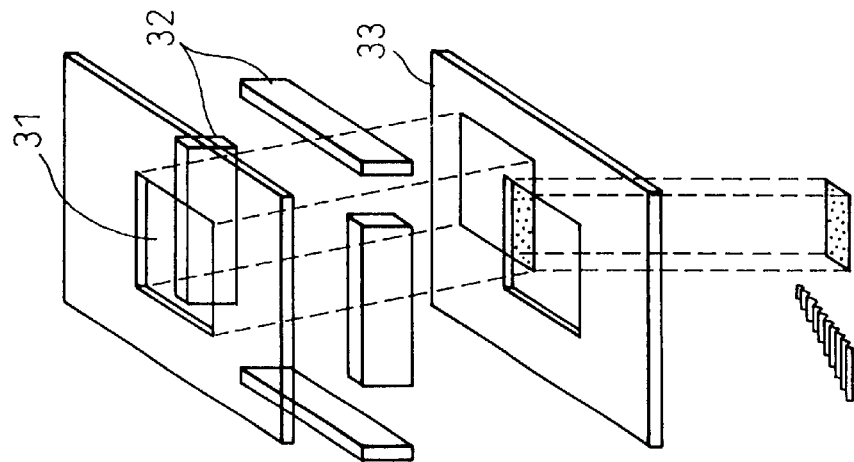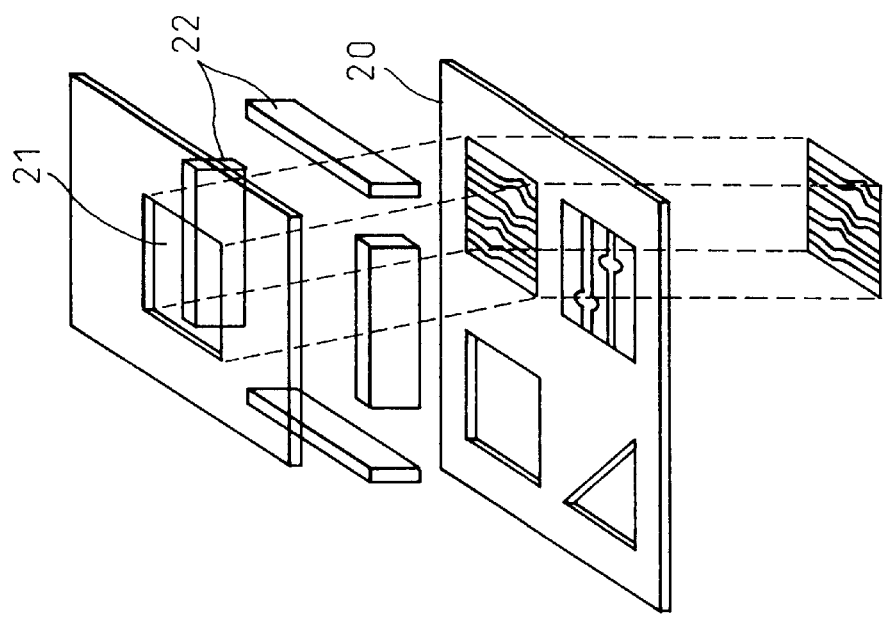

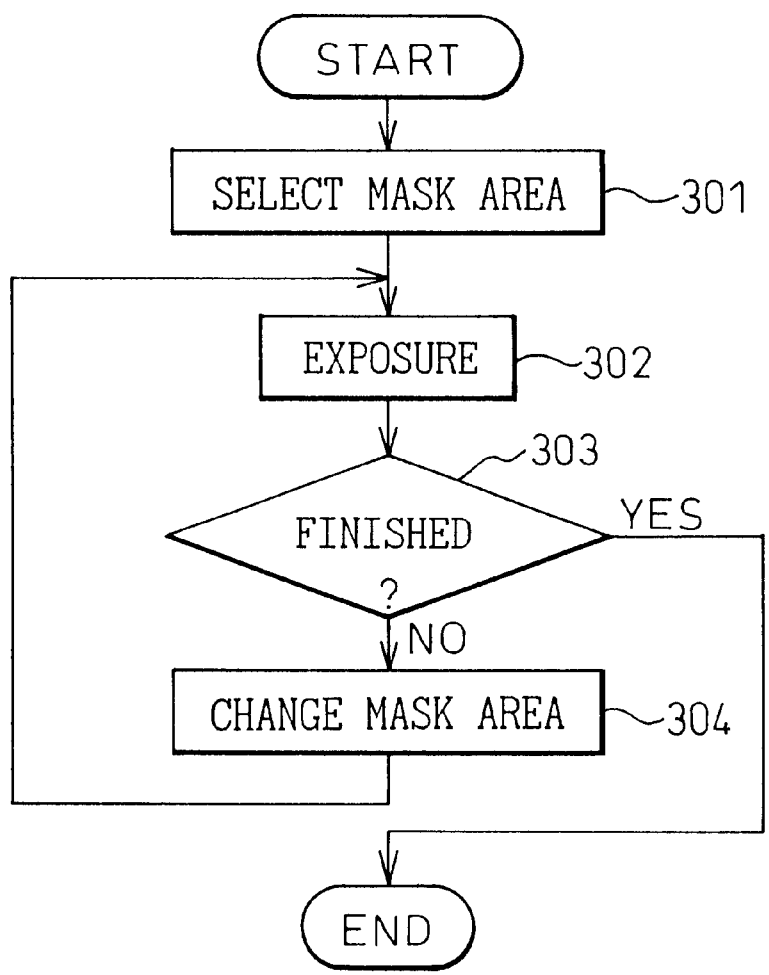

METHOD OF PRODUCING MASK DATA FOR PARTIAL ONE-SHOT TRANSFER EXPOSURE AND EXPOSURE METHOD

BACKGROUND OF THE INVENTION

The present invention relates to a partial one-shot transfer exposure technique, used in electron beam exposure or the like, for preparing a plurality of small mask patterns (block patterns) as an exposure pattern, exposing each small pattern by selecting the masks and exposing all the pattern by connecting the small patterns or, in particular, to a technique for preparing a mask for the small pattern.

With the recent great progress in the semiconductor techniques, the integration and functions of semiconductor integrated circuits (ICs) have been improved remarkably. Thus semiconductor techniques are expected to play central roles in technological development in all industries including the computer and the communication machine control industries. The integration of the IC has increased about four times every two or three years. The storage capacity of the dynamic access memory (DRAM), for example, has increased from 1 M, to 4 M, to 16 M, to 256 M and to 1 G. The high degree of integration of the IC depends to a large measure on the progress of micro patterning techniques for semiconductor production.

The limit of micro patterning techniques is currently defined by the pattern exposure technique (lithography). As a technique for pattern exposure, an optical exposure apparatus called a stepper is now used. In the optical exposure apparatus, the minimum width of the pattern that can be formed is defined by the wavelength of the exposure light source due to diffraction. A light source emitting ultraviolet light is used, and it is difficult to use light of a shorter wave length. To realize finer processing successfully, therefore, a new exposure method, other than the optical exposure apparatus, is now being planned.

In charged beam exposure and, especially, electron beam exposure, micro patterning less than 0.05 μm can be realized with the positioning accuracy of 0.02 μm. Charged beam exposure, however, is lower in throughput than the stepper and has, thus far, been thought to be unusable for mass production of LSIs. An electron beam exposure method will be explained as an example.

In an optical exposure apparatus, a photo mask corresponding to the pattern of the whole layer of the IC and the whole layer is exposed with one shot, thus leading to a high throughput. The high degree of integration of the IC, however, has made the production of the photo mask very difficult and has given rise to the problem of an increased cost and time required for producing the photo mask.

In the electron beam exposure method, various techniques including the blanking aperture array (BAA) method and the partial one-shot transfer exposure method have been proposed for improving the throughput.

The pattern of the whole layer of the IC cannot be exposed by the electron beam exposure method. Therefore, a partial one-shot transfer exposure method has been introduced in which the whole pattern is segmented into a plurality of small patterns, and a plurality of mask patterns (block patterns) corresponding to the small patterns are prepared for connecting the small patterns, followed by exposing the whole pattern. It is both difficult and deteriorates the efficiency to prepare block patterns corresponding to all the small patterns. Block patterns are prepared, therefore, only for the small patterns which repeatedly appear, while the other small patterns are scanned and exposed by a small beam or by exposing a pattern shaped by a method called the variable rectangle method described later. The partial one-shot transfer exposure method is generally called, and referred to hereinafter as, the block exposure method.

The block exposure method, as compared with the one-shot transfer exposure method for exposing the whole pattern with one shot, is low in throughput for production but has the advantage of a lower cost and a shorter time required for mask production. The block exposure method is used for the charged particle beam exposure method as well as for the electron beam exposure method and also is applicable to the optical exposure method. The electron beam exposure method will be referred to as an example in the description that follows.

FIG. 1 is a diagram showing a basic configuration of the optical system of the electron beam exposure apparatus of block exposure type. In FIG. 1, an electron beam emitted from an electron gun 11 is shaped in a first rectangular aperture 12 and, after being converted into a parallel beam by an electromagnetic lens and the like, enters a block mask 20 where it is shaped into the pattern of the block mask. A blanker 14 is an electrostatic deflector for deflecting the beam when shutting off the beam that has been passed through the block mask 20. When deflected, the beam is shut off by the last aperture 15 while, when it is not deflected, the beam passes through and is turned on. The beam that has passed through the last aperture 15 is deflected by a subdeflector 16 and a main deflector 17 and radiated onto a predetermined position on a sample (wafer) 18 placed on a stage. At the same time, the beams are focused on the sample 18 by an electromagnetic lens (configured with the coil 19 and a pole piece not shown). Specifically, the beam radiated on the sample 18 has a shape corresponding to the pattern of the block mask. The elements described above are encased in a housing called an optical column of which the part traversed by the electron beam is reduced in pressure to a vacuum.

The actual electron beam exposure apparatus comprises electron control circuits, not shown, such as an exposure control circuit for generating a signal for controlling the selection of one of a plurality of block patternson the block mask 20 in accordance with an exposure pattern and generating a deflection signal to be applied to the subdeflector 16 and the main deflector 17, a drive circuit for applying the signals output from these units to the various parts and a stage control circuit for controlling the movement of the stage.

FIG. 2A is a diagram for explaining the principle of the block exposure system, and FIG. 2B is a diagram for explaining the variable rectangular exposure system. As shown in FIG. 2A, in the block exposure system, the beam that has passed though a square opening 21, for example, is shaped into the shape of the opening 21. The beam thus shaped is deflected by the deflector 22 in such a manner as to pass through one of a plurality of block patterns arranged on the block mask 20. The block patterns have various opening shapes as shown.

As shown in FIG. 2B, in the variable rectangular exposure system, the beam that has passed through a first square opening 31 is shaped into the shape of the opening 321, deflected by a deflector 32, and enters a second square opening base 33. By changing the amount of deflection in the deflector 32, the position incident to the second opening base 33 is changed so that the shape of the beam that has passed through the second opening base 33 is changed. In this way, the beam is shaped into the desired rectangle. The IC pattern can be formed by combining rectangles, in all cases, and therefore any IC pattern can be exposed by the variable rectangle exposure system.

As described above, black patterns corresponding to all the small IC patterns are prepared, and the remaining small patterns are exposed by another method. The variable rectangle exposure method is also employed to expose such remaining small patterns with as high an efficiency as possible.

FIG. 3 is a diagram showing a configuration of the block mask 20 of an electron beam exposure apparatus. As shown, the block mask 20 has 12 mask areas 41. A plurality of block patterns 42 are arranged in each mask area 41. An opening 43 for changing the rectangle is formed at the four corners of each mask area 41. Comparison between FIGS. 2A and 2B apparently shows that the beam-shaping mechanism of the block exposure system is analogous with that of the variable rectangle system. In the embodiment, the block mask 20 is formed with a variable rectangle opening 43 by which the beam can be shaped into an arbitrary rectangle. By moving the mask area 41 along the optical axis, the beam can be shaped by being deflected to an arbitrary position within the mask area 41. In the case where another mask area 41 is used, the block mask 20 is moved by a moving mechanism, not shown, to thereby change the mask area 41 located on the optical axis.

The basic configuration of the electron beam exposure apparatus of block exposure type was explained above. Now, an explanations will be given about the conventional method of producing the mask data indicating a block pattern of the block mask. FIG. 4 is a diagram showing the data flow in the conventional process for producing the mask data and the exposure data.

In designing an IC device, the basic elements for circuit design called the cell are combined. In a logic circuit, for example, the cells are an inverter, an AND gate, a NAND gate, an OR gate, a NOR gate, an EXOR gate, an EXNOR gate, a flip-flop and a selector (multiplexer). In an analog circuit, on the other hand, the cells are an amplifier, a comparator, an A/D converter and a D/A converter. In a memory circuit, the cells are a memory cell, a sense amplifier and a decoder. In a CPU core circuit, the cells are a register and an arithmetic logic unit (ALU). Common cells such as a resistor and a capacitor are also included. The cells are designed in advance by the cell design means 51 taking the restraints in design rule, strategy, device performance and the exposure unit into consideration, and are stored in a cell library 52. In the device design means 53, the cells are arranged with reference to the cell library 52 and wiring is laid between the cells thereby, to design the desired device, and is stored as layout data 54. The cell library 52 is the basic resource and is used repeatedly for designing several types of device layout.

In fabricating a device designed in this way, the first step is to produce EB data, according to which the block mask is required to be produced. In the EB data production process 59, the mask layout 60 and the exposure data 61 are produced by performing the EB data production process based on various information including the design setting information, the layer involved, the design shift 55, the system restraint information, the mask restraints 56, the mask-related process setting information (mask) 57 and the exposure-related process setting information (exposure) 58. This process is very complex, and therefore only the portions directly-related to the invention will be explained.

The block mask 20 is limited to about 100 block patterns 42 in the mask area 41 which are selectable without movement as shown in FIG. 3. Therefore, the problem is which block pattern is to be used. The layout data 54 for the IC designed has patterns of the layers in hierarchical structure. By analyzing each layer, a plurality of repetitive patterns are extracted, and out of these patterns, a block pattern 42 to be arranged in the mask area 41 is selected taking into consideration the frequency of repetition. Further, the place where the selected block pattern 42 is to be arranged in the mask area 41 is determined taking the frequency, etc. into consideration. After that, in accordance with the system restraint information, the mask restraints 56 and the mask-related process setting information (mask) 57, the line width of the block pattern 42 is determined thereby to produce the mask layout 60. Based on this mask layout 60, the block mask 20 is produced. For the remaining mask areas 41, a layer exposed in the next process or the block pattern used for the device next to be produced is provided.

Further, in accordance with the mask layout 60, the exposure data 61 including the block pattern select information and the corresponding information on deflection position is produced and stored. The block mask 20 thus produced is mounted on the exposure unit 63 and the exposure is performed in accordance with the exposure data 61.

In the memory device, a multiplicity of memory cells are arranged regularly, which part represents the greater proportion of the exposure area. A high efficiency is obtained, therefore, with the block exposure system. The electron beam exposure method of the block exposure type is thus developed primarily for the purpose of exposure of the memory device, whereby the throughput for the exposure of the memory has actually been considerably improved.

For the memory, for which a vast number of the same devices are fabricated, however, the optical exposure apparatus is more advantageous in cost even though the photomask is high in cost and the mask production consumes a long time. Thus, the chance of using the electron beam exposure apparatus for production of the memory device is considered small.

In recent years, the system LSI has come to be used in various fields. Since the system LSI is not produced in great numbers as compared with the memory device, however, the mask cost and the production time pose a great problem. The effectiveness of the use of the optical exposure method, therefore, is dubious. Thus, the electron beam exposure method of block exposure type is likely to be used for mass production of the system LSI rather than the memory device.

Nevertheless, the system LSI tends to be produced in small amounts, many models and with a short turnaround time (TAT), and therefore the exposure with a high throughput without producing the mask for each device is required. In the electron beam exposure method, as described above, all the patterns can be exposed by use of the variable rectangle exposure method without mask production. A multiplicity of shots required for exposing the whole pattern and a low throughput make this method in practical.

A realistic solution to this problem is electron beam exposure of a block exposure type. The block mask used for the electron beam exposure apparatus can be produced more easily than the photomask which is used in the most advanced stepper because the reduction ratio of the block mask is about one fiftieth and the reduction ratio of the photomask is about one fifth, therefore, the line width of the block mask is larger than that of the photomask. Thus, this method is much more advantageous in cost and lead time (delivery date). Nevertheless, the ratio of the block mask production cost to the total production cost and a further reduction in TAT are required.

SUMMARY OF THE INVENTION

The object of the present invention is to provide a method of producing the mask data for the partial one-shot transfer (block) exposure suitable for fabrication of integrated circuits such as a system LSI produced in a small amount, a multiplicity of models and a short turnaround time (TAT) with a reduced ratio of the block mask production cost to the total production cost and TAT, and a method of exposure using the mask data.

The present inventor has taken note of the fact that an integrated circuit is designed by wiring a combination of the basic elements, called cells, prepared in advance.

According to one aspect of the invention, there is provided a method of producing mask data of a block mask including a plurality of block patterns used for the partial one-shot transfer exposure in which at least a part of the pattern of an integrated circuit designed at least partially by combining a plurality of basic elements is passed and shaped through selected ones of the block patterns and the radiated pattern shaped beams are combined for exposure, the method comprising the steps of:

generating a pattern group for each layer of the integrated circuit including a plurality of the basic elements;

analyzing the degree of frequency at which each basic element is used in the integrated circuit;

selecting from the pattern group a pattern used as a plurality of the block patterns based on the analyzed degree of frequency at which each basic element is used;

determining a mask layout by determining the arrangement of the selected pattern in the block mask; and deforming each pattern of the mask layout based on the process conditions and generating the mask data indicating the shape of a plurality of the block patterns, while at the same time generating auxiliary information including the information on the arrangement of a plurality of the block patterns on the block mask.

As described above, in the prior art, each layer of the layout data of the device is analyzed to extract a plurality of repetitive patterns, out of which a block pattern is selected taking the repetition frequency, etc. into account. The repetitive pattern can be easily found in a portion like a memory cell array where the presence of a repetitive pattern is known. In such parts as the logic circuit, the analog circuit and the CPU core, however, it is very difficult to extract a repetitive pattern itself. This is also the case with the parts other than the memory cell array of the memory device. According to this invention, in contrast, the block patterns are arranged in correspondence with the cells (basic elements) used for the device design, and therefore the degree of frequency in which each block pattern appears can be determined very easily from the degree of frequency at which the particular cell is used in the design data. Also, the exposure position of the block pattern corresponding to the cell can be easily determined.

The cell is a basic unit for device design. The cell can be shared by a plurality of devices, and therefore a corresponding pattern can be used commonly for the exposure of different devices at the same time. In such a case, the frequency of use of each cell is analyzed, if required, by analyzing the degree of frequency at which it is used for a plurality of devices. In the system LSI, in particular, the basic elements such as the CPU core, the logic circuit, memory and the analog circuit are prepared, for which the range of use is changed or the wiring is set for design. Thus almost all the used cells are shared. In the case of the block mask according to the invention, therefore, a combination is obtained similar to the combination of block patterns each of which is determined for each device. The wiring is expected to be varied considerably from one device to another, but retains the same throughput since the wiring is exposed by the variable rectangle method. In the prior art, the block pattern is determined for each device.

As an alternative, in the case where the devices are classified into a plurality of groups and the degree of frequency at which each element is used is analyzed, the degree of frequency at which the devices of each group is analyzed and a plurality of block masks corresponding to each group are produced. This classification is based, for example, on the result of analyzing the degree of frequency at which each element is used in an integrated circuit. For the IC such as a system LSI with various devices mounted thereon, the relative degree of frequency at which the circuit parts are used is different depending on the applications, and therefore the classification into a plurality of groups is made in accordance with the combination of devices mounted on the integrated circuit.

When a plurality of block masks are formed, they are formed on different mask areas 41 as shown in FIG. 3, for example.

In the case where the exposure is carried out using the block mask produced in accordance with the mask data prepared as described above, the exposure data for selecting the blockpattern corresponding to the pattern to be exposed and the deflection data for deflecting the beam shaped into the selected block pattern to a position of radiation are produced from the design data of the integrated circuit and the auxiliary information, and the exposure operation is carried out in accordance with the exposure data and the deflection data.

The production of the optimum block mask for one or a plurality of devices has been described above. As an alternative, a plurality of different sets of block patterns corresponding to the cells are prepared, and a given set suitable for the pattern to be exposed may be selected. Also, it may be determined whether the particular set can produce a sufficient throughput, and if not, a block mask may be produced.

Specifically, according to a second aspect of the invention, there is provided a method of producing mask data of a block mask including a plurality of block patterns used for the partial one-shot transfer exposure in which at least a part of the pattern of an integrated circuit designed at least partially by combining a plurality of basic elements is passed and shaped through selected ones of the block patterns and the radiated pattern shaped beams are combined for exposure, the method comprising the steps of:

arranging a pattern selected from the pattern group in each layer of a plurality of the basic elements, and producing a plurality of mask layers at least partially different from the arrangement of the selected pattern;

counting the degree of frequency at which each basic element in the integrated circuit to be exposed is used;

determining the optimum mask layout from a plurality of the mask layouts based on the counted degree of frequency at which each basic element is used; and deforming each pattern of the determined optimum mask layout based on the process conditions, and producing the mask data indicating the shape of a plurality of the block patterns.

As an alternative, a plurality of block masks are prepared in advance for a plurality of corresponding mask layouts, and a suitable one of the block masks is selected and used. In such a case, a plurality of the block masks are formed in different mask areas 41 as shown in FIG. 3, for example.

BRIEF DESCRIPTION OF THE DRAWINGS

The features and advantages of the invention will be more clearly understood from the following description taken in conjunction with the accompanying drawings, in which:

FIG. 2A is a diagram for explaining the basic configuration of a block exposure system;

FIG. 2B is a diagram for explaining the basic configuration of a variable rectangle exposure system;

FIG. 10 is a flowchart showing the process for exposing a device using a plurality of mask areas during exposure of one layer.

DESCRIPTION OF THE PREFERRED EMBODIMENTS

Figure 1:
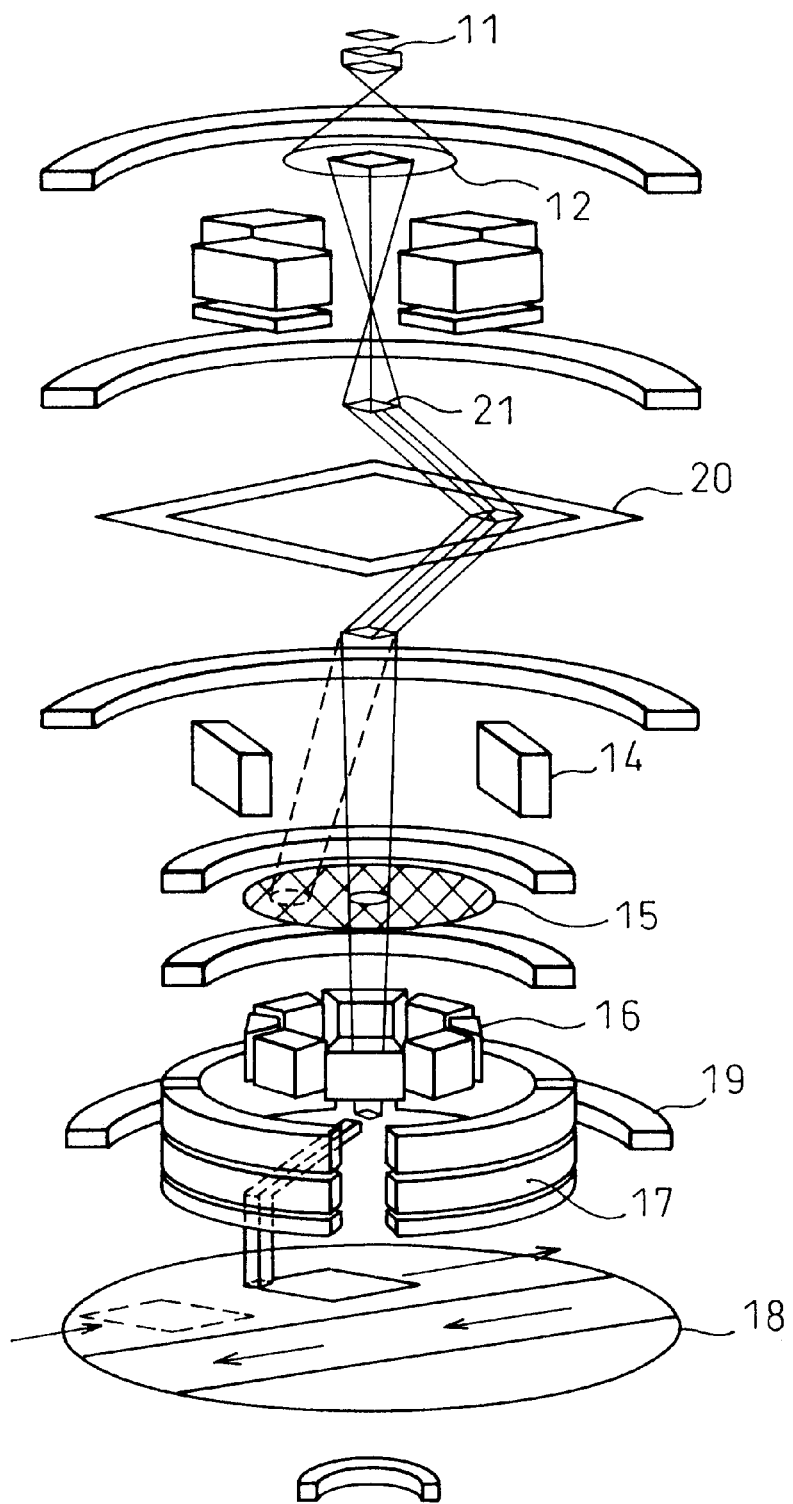
FIG. 1 is a diagram showing an example of the configuration of an electron beam exposure apparatus of block exposure type.
Figure 3:
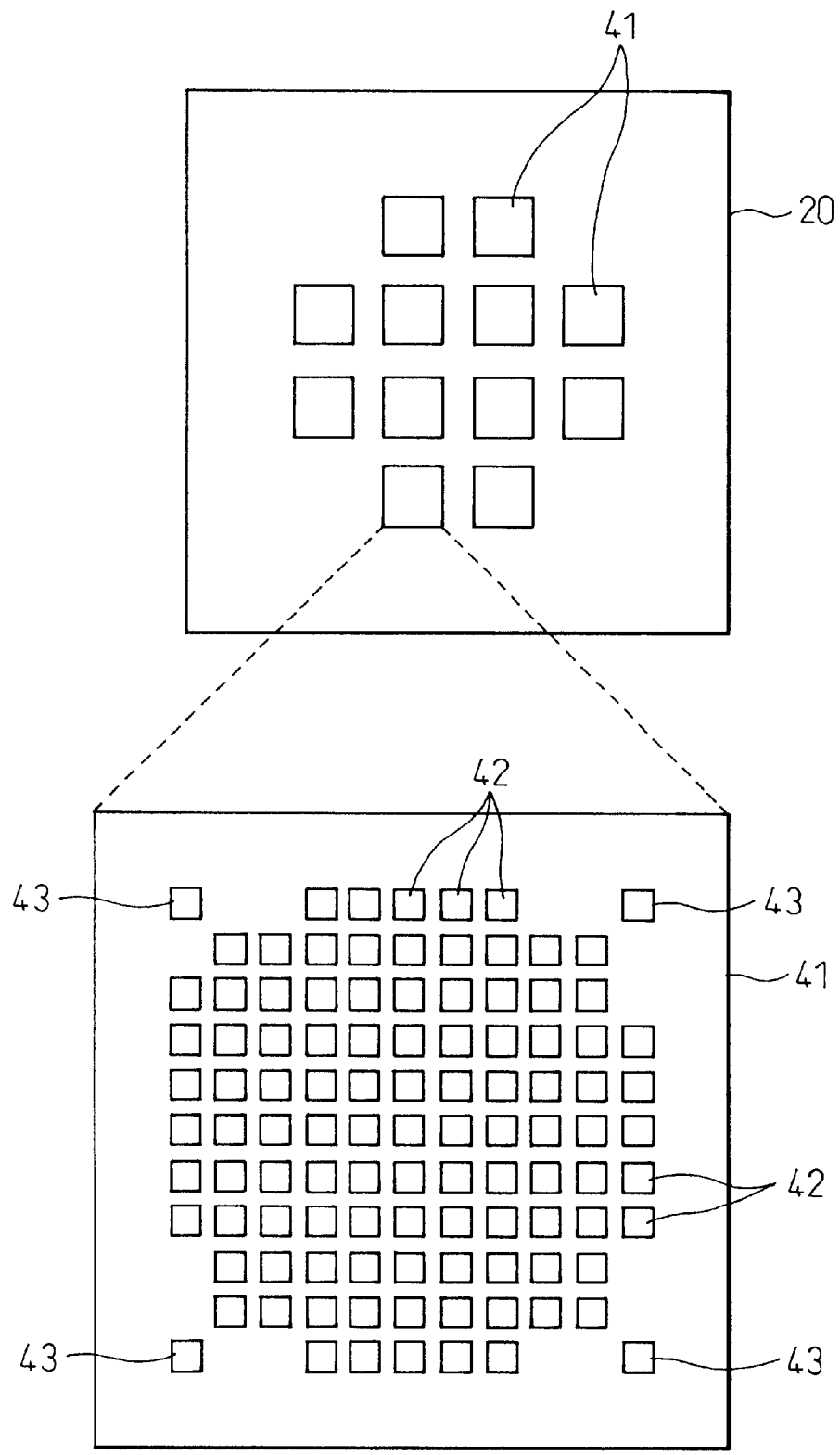
FIG. 3 is a diagram showing an example of a block mask.
Figure 4:
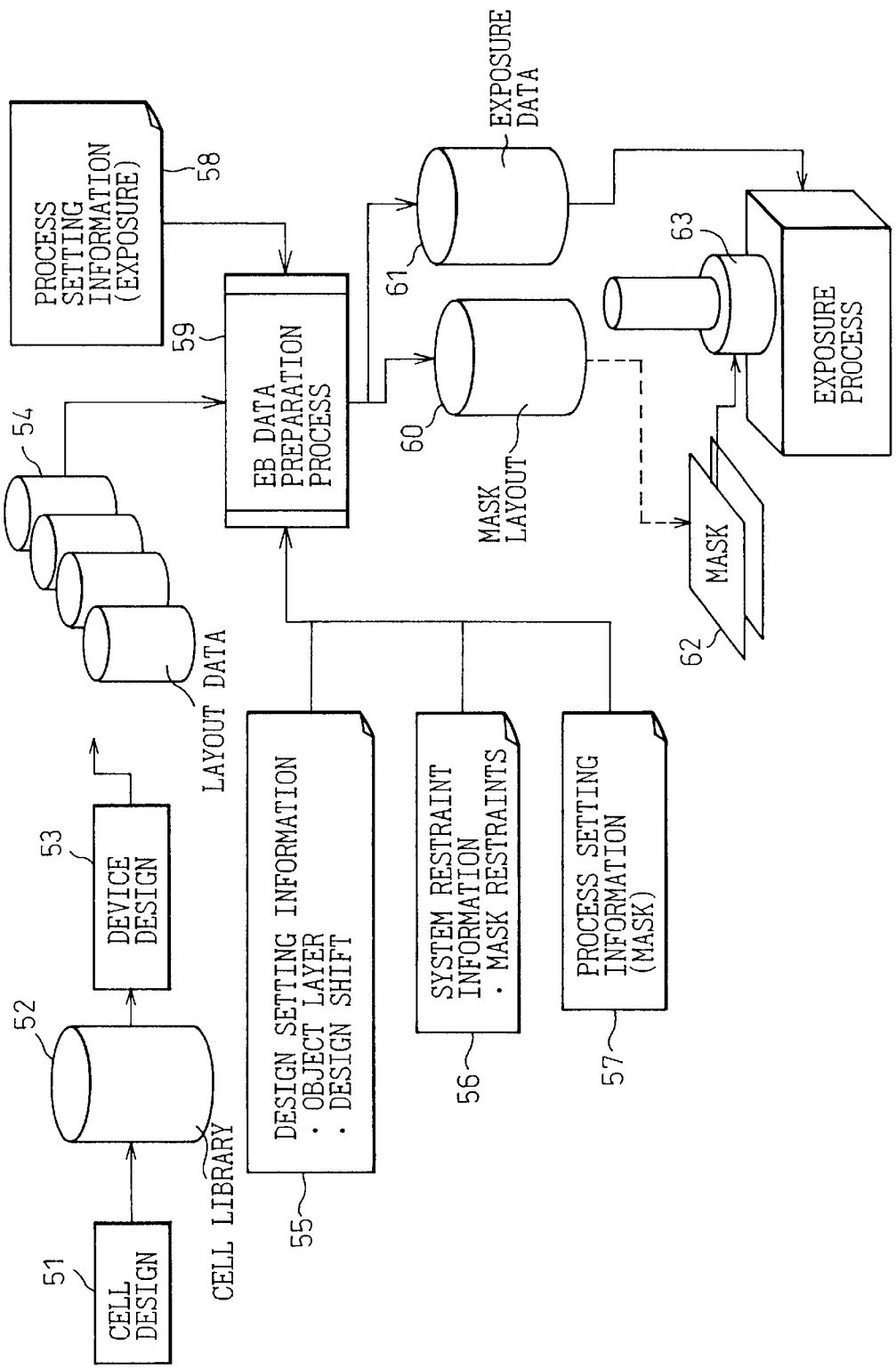
FIG. 4 is a diagram showing the data flow related to the production of the mask data and the exposure data in the conventional electron beam exposure apparatus of block exposure type.
Figure 5:
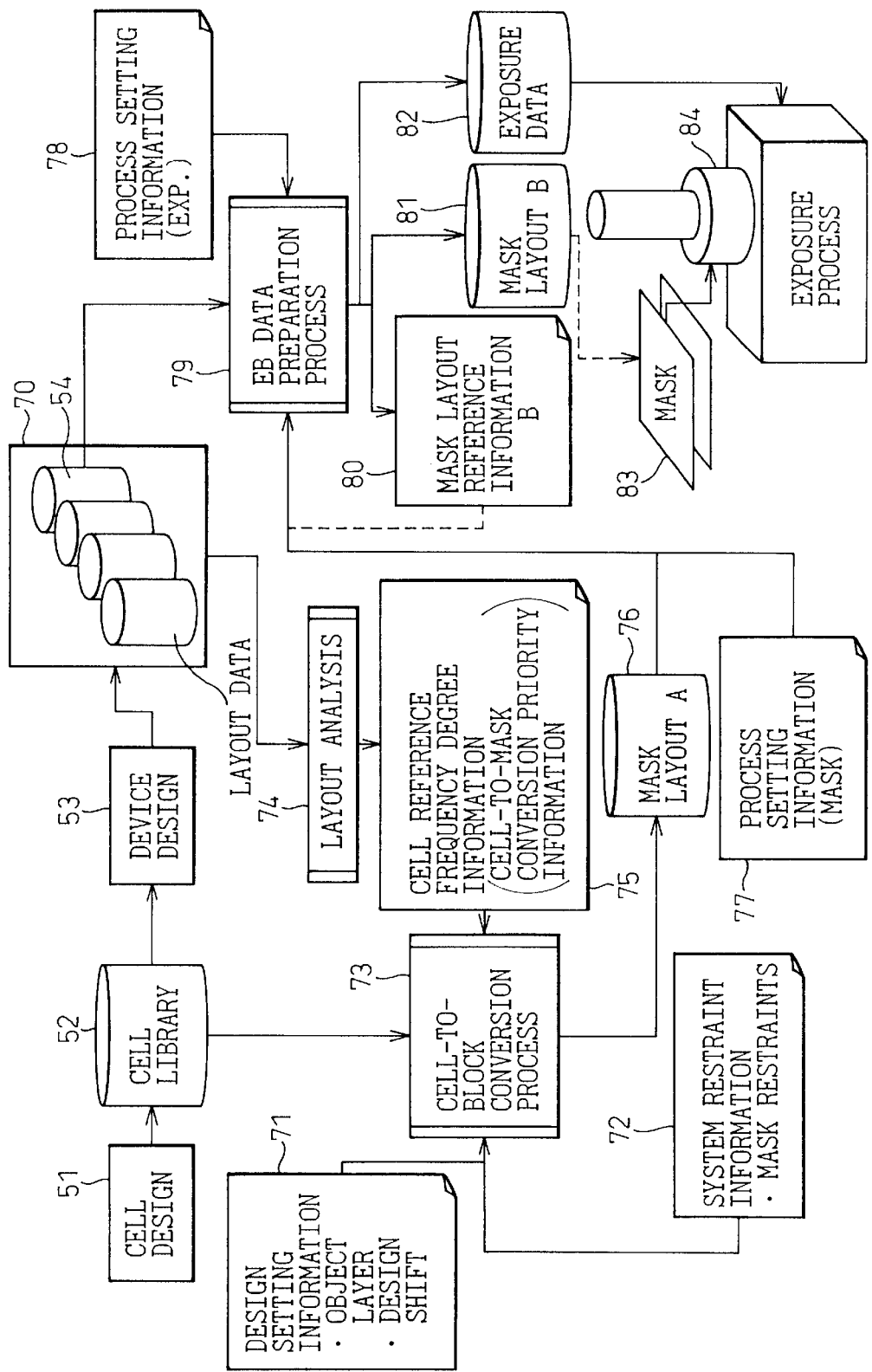
FIG. 5 is a diagram showing the data flow related to the production of the mask data and the exposure data in the electron beam exposure apparatus of block exposure type according to a first embodiment of the invention.
Figure 6:
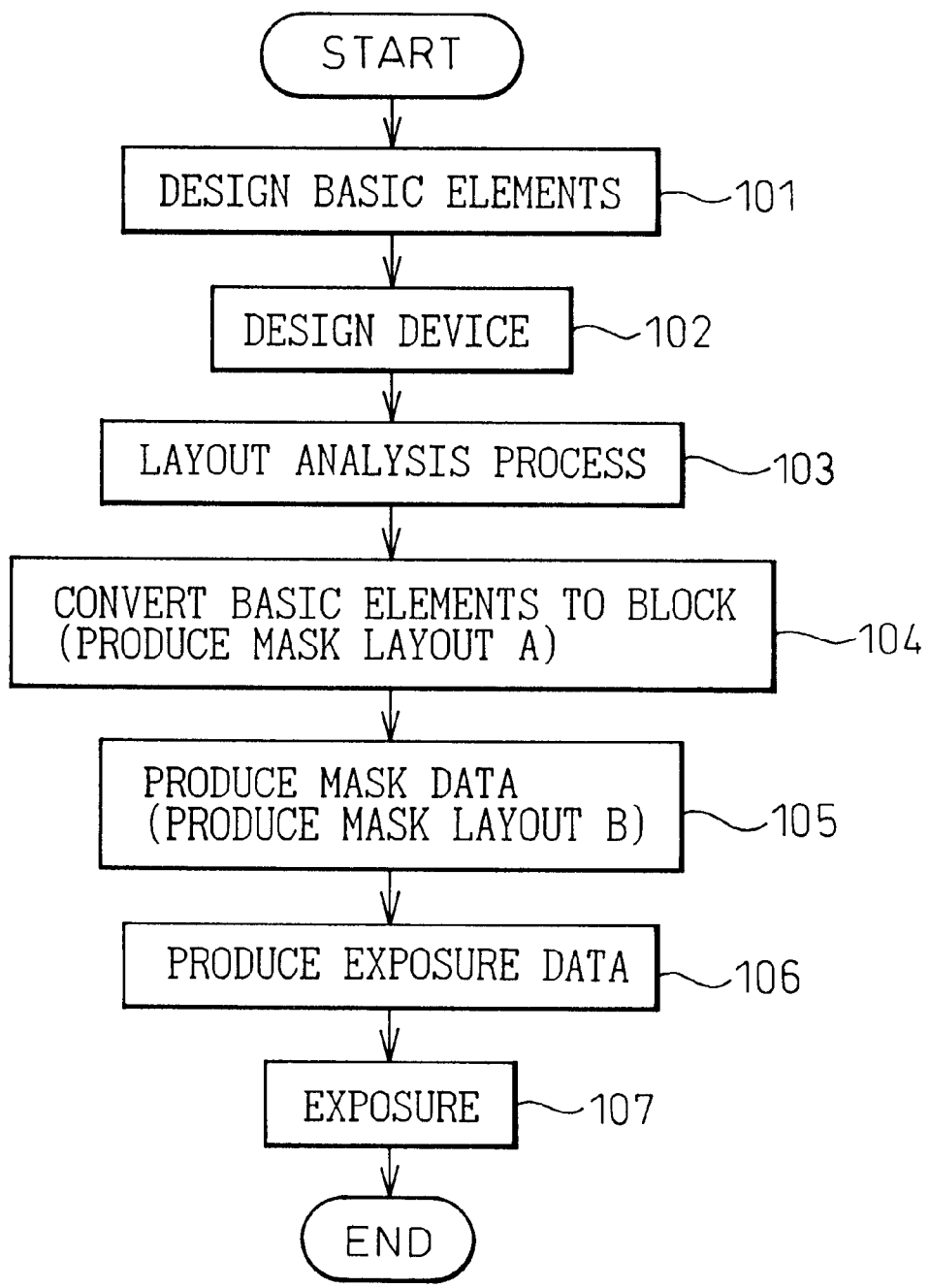
FIG. 6 is a flowchart showing the process according to the first embodiment.

FIG. 5 is a diagram corresponding to FIG. 4 showing the flow of data including the process for producing the mask data and the exposure data for an electron beam exposure apparatus according to a first embodiment of the invention. FIG. 6 is a flowchart showing the process related to the process for producing the mask data and the exposure data according to the first embodiment. The process for producing the mask data and the exposure data according to the first embodiment will be explained below with reference to FIGS. 5 and 6.

In step 101, the basic elements (cells) are designed in a cell design process 51 taking into consideration the design rule, the strategy, the device performance and the restraints in the electron beam exposure apparatus. The data related to various types of cell designed are stored in a cell library 52.

In step 102, the cells stored in the cell library 52 are combined in the device design process 53, and by wiring between them, layout data 54 corresponding to each device is produced. According to this embodiment, assume that a system LSI is to be designed and fabricated. For the system LSI, the basic configuration including a CPU core, a logic circuit, a memory and ananalog circuit is prepared in advance, and the range of application of these elements is changed or the wiring thereof is set as a designing process. Specifically, a multiplicity of devices are designed from a single cell library 52 thereby to produce a group 70 including a plurality of layout data 54.

In step 103, the plurality of layout data 54 in the group 70 is analyzed in the layout analysis process 74 and, by counting the frequency at which each cell is referred to, producing the cell reference frequency information (cell-to-mask change priority information) 75. This information indicates the order of priority in which the cells are changed to masks.

In step 104, the process for converting the basic elements (cells) to block patterns is performed in the cell-to-block conversion process 73. First, by reference to the cell reference frequency information 75 and the system restraint information/mask restraints 72, the cells to be changed to masks are determined thereby to produce a mask layout A76. In the process, with reference to the design setting information/object layer/design shift 71 containing information such as the object layer and the design shift value and the system restraints/mask restraints 72 constituting information mainly on the restraints of the block mask pattern, it is determined whether conditions of a block pattern are met by the pattern of a specific layer of the cell to be changed to a mask. In the case of a complicated cell, for example, the cell pattern is so large that it may not be encased in the block pattern. In such a case, the cell pattern is formed with a plurality of block patterns by such process as segmentation. In the final step, the process shift information and dose information for changing the line width in accordance with the process are added to the mask layout A76.

In step 105, a mask layout B is produced in the EB data production process 79 with reference to the mask layout A designated by 76, the mask-related process setting information (mask) 77 and the exposure-related process setting information (Exp) 78. At the same time, the mask layout reference information 80 indicating the position of each block pattern on the block mask is produced. Based on the mask layout B, a block mask 83 is produced.

In step 106, the exposure data 82 corresponding to the layout data 54 is produced with reference to the mask layout B and the mask layout reference information 80. The exposure data 82 contains the deflection data for selecting a block pattern on the block mask and the deflection data for deflecting the block pattern to the desired position of radiation. Further, the data for adjusting the exposure amount is added by the proximity effect correction.

In step 107, after mounting the produced block mask, the exposure process is performed in accordance with the exposure data 82.

As described above, as compared with the prior art in which a plurality of repetitive patterns are extracted by analyzing each layer of the layout data of each device, the first embodiment is such that a required cell corresponding to a particular block pattern is determined based on the frequency at which the particular cell is used in the group making up the layout data of a plurality of devices. This greatly facilitates the determination, and a common block mask can be used for a plurality of devices. This is very effective especially for producing the mask data and the exposure data for the system LSI.

Figure 7:
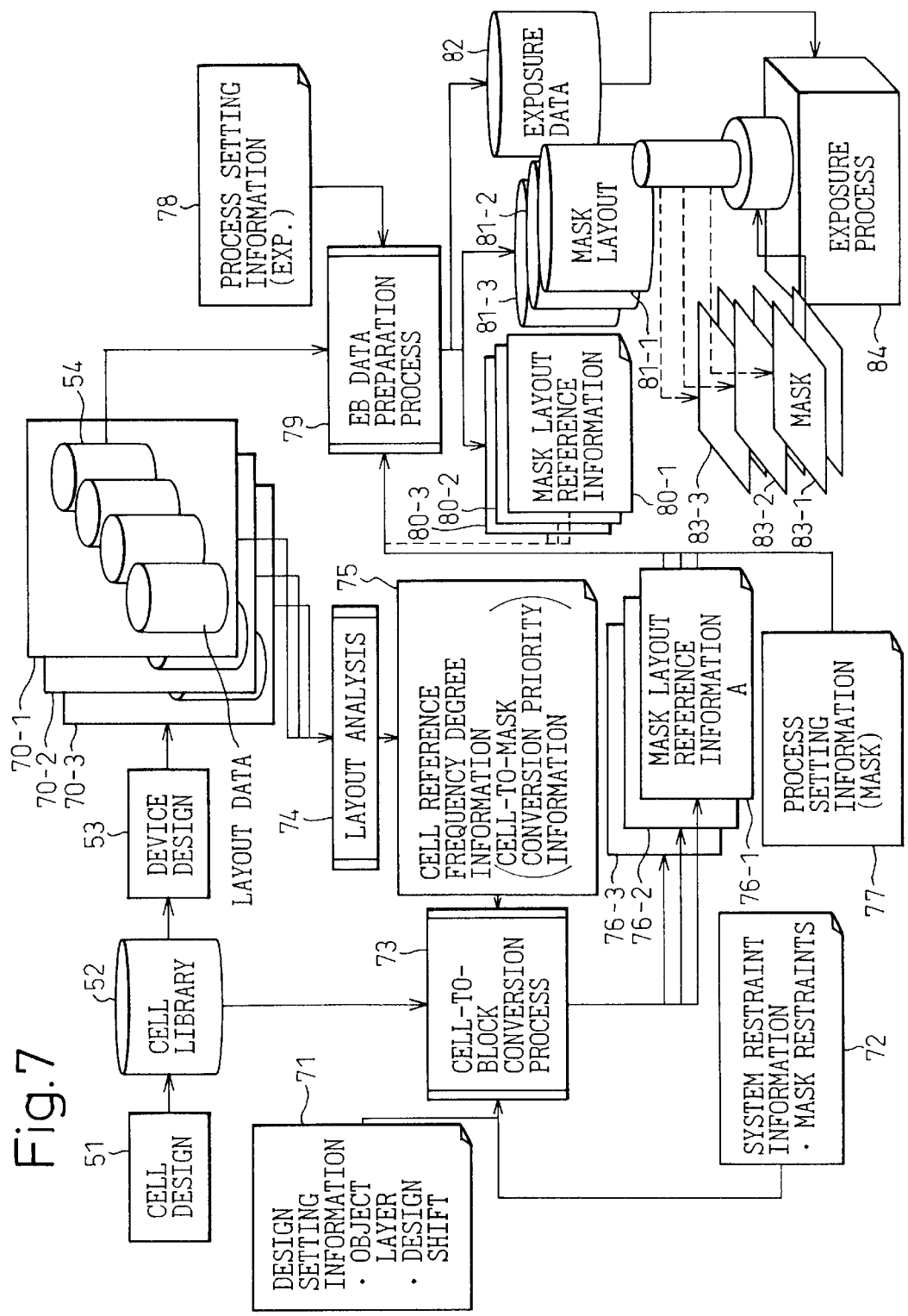
FIG. 7 is a diagram showing the data flow related to the production of the mask data and the exposure data in the electron beam exposure apparatus of block exposure type according to a second embodiment of the invention.

FIG. 7 is a diagram corresponding to FIG. 5 and shows the data flow of the process for producing the mask data and the exposure data in the electron beam exposure apparatus according to the second embodiment of the invention.

As compared with FIG. 5, it is apparent that the second embodiment is different from the first embodiment in that the layout data 54 for a plurality of devices are classified into a plurality of groups 70-1 to 70-3, so that the mask layout reference information A designated by 76-1 to 76-3, the mask layouts B designated by 81-1 to 81-3 and the mask layout reference information 80-1 to 80-3 are produced for each group, and according to these information, a plurality of block mask 83-1 to 83-3 are produced.

According to the first embodiment, one block mask is produced for the group 70 made up of the layout data 54 for a plurality of devices, which block mask was shared by the devices in the group for conducting the exposure. In the case of an IC having various circuit elements mounted therein such as the system LSI, however, different circuit portions are used more frequently in different applications. Thus, the exposure may be performed more efficiently when the layout data 54 for a plurality of devices are classified into a plurality of groups and the block mask is produced for each group. Classification into groups is accomplished, for example, based on the result of analysis of the frequency at which cells are used in each device. In the case of an IC having various circuit elements mounted together therein such as the system LSI, different circuit portions are used more frequently in different applications, as described above, and therefore classification into a plurality of groups is performed in accordance with the combination of the devices mounted in the integrated circuit.

Figure 8:
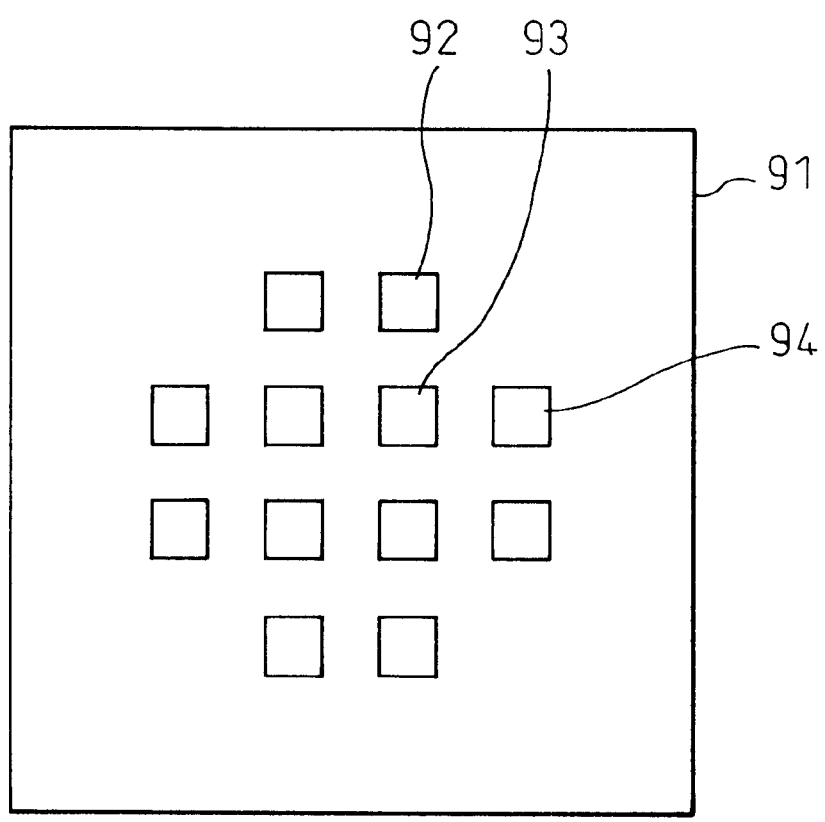
FIG. 8 is a diagram showing a block mask with a plurality of block pattern groups arranged in each mask area.

In the case where a plurality of block masks are formed, a plurality of mask areas 92 to 94 are arranged in the block mask 91 as shown in FIG. 8, for example, and the block patterns of three groups are formed in each of the three mask areas 92 to 94. By doing so, the group used can be easily changed.

Figure 9:
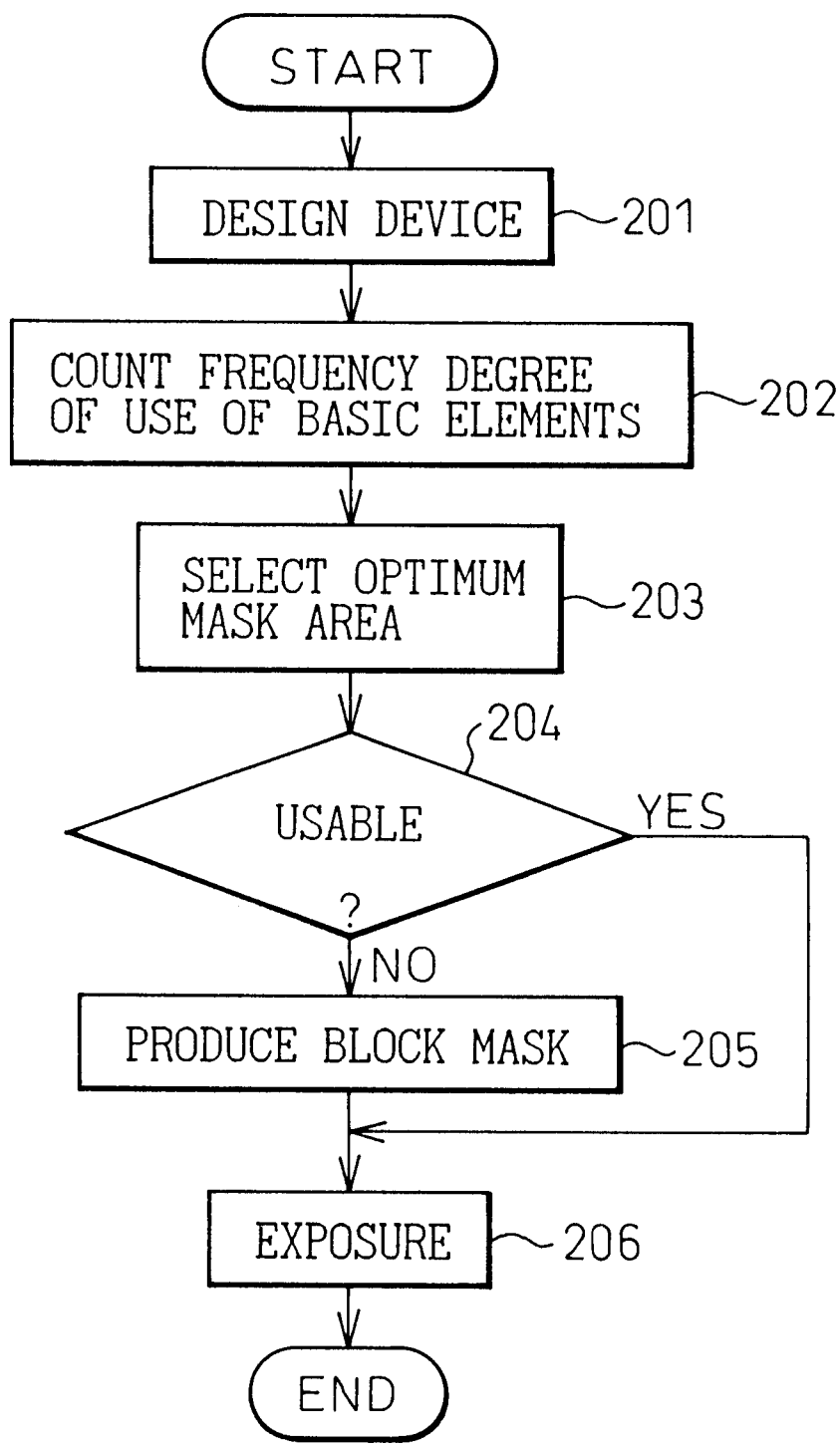
FIG. 9 is a flowchart showing the process for exposing a newly designed device using the existing block mask.

FIG. 9 is a flowchart showing the process for selecting a block mask in the electron beam exposure apparatus according to a third embodiment of the invention.

In the first and second embodiments, a block mask is produced in accordance with the group of the designed device. According to the third embodiment, on the other hand, a plurality of different sets of block patterns corresponding to cells are prepared in advance, and a set, if any, suitable for the pattern to be exposed is selected, while in the absence of such a set, a new block mask is produced. The latter applies to a case such as the second embodiment, in which a block mask is produced for the group of the layout data for the device that has been designed, and it is determined whether exposure for a newly designed device using the existing block mask is desirable or not. It is assumed that the block patterns of each group are formed in each mask area shown in FIG. 8.

In step 201, a device is designed using the cell library 52. In step 202, the frequency at which the cells are used in the device designed is counted. In step 203, the counted frequency at which the cells are used is compared with the cells corresponding to the block patterns in the existing block mask, and a mask area is selected which has the greatest number of block patterns corresponding to the cells used frequently. In step 204, it is determined whether fully efficient exposure is possible or not in the selected mask area. This determination uses, for example, the total number of shots for exposure with the block patterns. Once it is determined that a fully efficient exposure is possible, the process proceeds to step 206, where the exposure is performed using the block patterns in the selected mask area. In the case where it is determined that a fully efficient exposure is impossible, however, the process proceeds to step 205 to produce a new block mask.

In the first to third embodiments, it was explained that the block patterns in only one mask area are used for exposing the pattern of one layer, i.e. that the mask area is not changed by moving the block mask during the exposure of one layer. In the system LSI or the like in which different types of devices including the CPU core, the logic circuit, the analog circuit and the memory are mounted together, however, the number of block patterns formed in one mask area may not be sufficient to perform an efficient exposure. In such a case, the mask area used during the exposure of one layer may be changed. By doing so, the number of the types of the block patterns used increases. FIG. 10 is a flowchart showing the process performed by using a plurality of mask areas during the exposure described above. As shown in FIG. 10, in step 301, a mask area is selected, and all the exposure using the block patterns in the selected mask area is conducted in step 302. In step 303, it is determined whether the exposure for all the block patterns is complete, and if not, the interior of the mask area is changed in step 304, followed by a return to step 302.

It will thus be understood from the foregoing description that according to this invention, at the time of exposure of a fine pattern using an electron beam or the like, the mask production cost can be greatly reduced while maintaining the exposure efficiency of the partial one-shot transfer exposure method, and further the TAT from the completion of the IC design to the completion of the device process can be shortened.

What is claimed is:

1. A method of producing mask data of a block mask including a plurality of block patterns used for a partial one-shot transfer exposure in which at least a part of the pattern of an integrated circuit designed at least partially by combining a plurality of basic elements to form a plurality of devices is passed and shaped through selected ones of the block patterns and the radiated pattern shaped beams are combined for exposure, the method comprising the steps of:

generating a pattern group for each layer of said integrated circuit including a plurality of said basic elements;

analyzing the degree of frequency at which each basic element is used in a plurality of devices in said integrated circuit;

selecting from said pattern group a pattern used as a plurality of said block patterns based on the analyzed degree of frequency at which each basic element is used in a plurality of devices;

determining a mask layout by determining an arrangement of the selected pattern in said block mask; and deforming each pattern of said mask layout based on the process conditions and generating a mask data indicating the shape of a plurality of said block patterns, while at the same time generating auxiliary information including the information on the arrangement of a plurality of said block patterns on said block mask.

2. A method of producing mask data for the partial one-shot transfer exposure according to claim 1, further comprising the steps of:

analyzing the degree of frequency at which each of said basic elements is used in a plurality of integrated circuit; and generating a block mask shared by the patterns of a plurality of said integrated circuits for exposure.

3. A method of producing mask data for the partial one-shot transfer exposure according to claim 2, further comprising the steps of:
- classifying a plurality of said integrated circuits into a plurality of groups;
- analyzing the degree of frequency at which each of said basic elements is used in each group of said integrated circuits; and
- producing a plurality of block masks corresponding to each group.

4. A method of producing mask data for the partial one-shot transfer exposure according to claim 3, wherein said classification of a plurality of said integrated circuits into a plurality of said groups is accomplished based on the result of analysis of said degree of frequency at which each of said basic elements is used in said integrated circuits.

5. A method of producing mask data for the partial one-shot transfer exposure according to claim 3, wherein a plurality of said integrated circuits are system integrated circuits having various devices mounted thereon, and said classification of a plurality of said integrated circuits into a plurality of said groups is accomplished in accordance with the combination of the devices mounted on said integrated circuits.

6. A method of producing mask data for the partial one-shot transfer exposure according to claim 3, wherein a plurality of said block masks are formed at a distance from each other on a single substrate, and the block mask to be used can be selected by a selection mechanism.

7. A partial one-shot transfer exposure method using a block mask obtained from the mask data produced by the mask data production method for the partial one-shot transfer exposure according to claim 1, further comprising the steps of:
- producing the exposure data for selecting a block pattern corresponding to the pattern to be
- exposed and the deflection data for deflecting the shaped beam to a position for radiating the selected block pattern from the design data for said integrated circuits and said auxiliary information; and
- performing the exposure in accordance with said exposure data and said deflection data.

8. A method of producing mask data for the partial one-shot transfer exposure according to claim 1, wherein the basic elements are cells for circuit design.

9. A method of producing mask data for the partial one-shot transfer exposure according to claim 8, wherein the cells are designed in advance.

10. A method of producing mask data of a block mask including a plurality of block patterns used for a partial one-shot transfer exposure in which at least a part of the pattern of an integrated circuit designed at least partially by combining a plurality of basic elements to form a plurality of devices is passed and shaped through selected ones of the block patterns and the radiated pattern shaped beams are combined for exposure, the method comprising the steps of:
- arranging a pattern selected from the pattern group in each layer of a plurality of said basic elements, and producing a plurality of mask layers at least partially different from the arrangement of the selected pattern;
- counting the degree of frequency at which each basic element in a plurality of devices in the integrated circuit to be exposed is used;
- determining an optimum mask layout from a plurality of the mask layouts based on the counted degree of frequency at which each basic element is used in a plurality of devices; and
- deforming each pattern of said determined optimum mask layout based on the process conditions, and producing the mask data indicating the shape of a plurality of said block patterns.

11. A method of producing mask data according to claim 10, wherein the basic elements are cells for circuit design.

12. A method of producing mask data according to claim 11, wherein the cells are designed in advance.

13. A partial one-shot transfer exposure method for exposing at least a pattern of the integrated circuit designed by combining a plurality of basic elements at least partially, said pattern being exposed by combining the radiated pattern beams shaped by being passed through selected ones of a plurality of block patterns of a block mask, the method comprising the steps of:
- arranging a pattern selected from a pattern group in each layer of a plurality of basic elements, and forming on a single substrate a plurality of block masks at a distance from each other corresponding to a plurality of mask layouts having an arrangement different at least partially from the selected pattern, the block masks being selectable for exposure;
- counting the degree of frequency at which each basic element is used in a plurality of devices in the integrated circuit to be exposed;
- determining an optimum mask layout from a plurality of said mask layouts based on the counted degree of frequency at which each basic element is used in a plurality of devices;
- selecting a block mask to be used, based on the optimum mask layout determined and the process conditions; and
- exposing the integrated circuit with the selected block mask.

14. A method according to claim 13, wherein the basic elements are cells for circuit design.

15. A method according to claim 14, wherein the cells are designed in advance.

* * * * *